US010860252B2

(12) United States Patent
Yang et al.

(10) Patent No.: US 10,860,252 B2
(45) Date of Patent: Dec. 8, 2020

(54) MEMORY APPARATUS AND METHODS WITH HETEROGENEOUS MEMORY ARRAY ARCHITECTURE

(71) Applicant: Research & Business Foundation Sungkyunkwan University, Suwon-si (KR)

(72) Inventors: Joon Sung Yang, Suwon-si (KR); Tae Hyun Kwon, Suwon-si (KR); Imran Muhammad, Suwon-si (KR); Jung Min You, Suwon-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 47 days.

(21) Appl. No.: 16/353,018

(22) Filed: Mar. 14, 2019

(65) Prior Publication Data
US 2019/0286372 A1  Sep. 19, 2019

(30) Foreign Application Priority Data

Mar. 16, 2018  (KR) .......................... 10-2018-0030930

(51) Int. Cl.
| | |
|---|---|
| *G06F 12/00* | (2006.01) |
| *G06F 13/00* | (2006.01) |
| *G06F 3/06* | (2006.01) |
| *G11C 16/26* | (2006.01) |
| *G11C 29/52* | (2006.01) |
| *G11C 16/10* | (2006.01) |
| *G11C 11/56* | (2006.01) |
| *G06F 11/10* | (2006.01) |

(52) U.S. Cl.
CPC .......... *G06F 3/0659* (2013.01); *G06F 3/0604* (2013.01); *G06F 3/0688* (2013.01); *G06F 11/1068* (2013.01); *G11C 11/5628* (2013.01); *G11C 16/10* (2013.01); *G11C 16/26* (2013.01); *G11C 29/52* (2013.01)

(58) Field of Classification Search
CPC .. G06F 3/0604; G06F 3/0688; G06F 11/1068; G06F 12/0246; G06F 3/0679; G11C 11/5628
See application file for complete search history.

(56) References Cited

U.S. PATENT DOCUMENTS

| | | | |
|---|---|---|---|
| 2014/0006688 A1 | 1/2014 | Yu et al. | |
| 2014/0173184 A1 | 6/2014 | Kim et al. | |
| 2015/0179268 A1 | 6/2015 | Kim et al. | |
| 2018/0129440 A1* | 5/2018 | Bandic | G06F 3/0688 |

FOREIGN PATENT DOCUMENTS

KR  10-2014-0078892 A  6/2014

* cited by examiner

*Primary Examiner* — Sean D Rossiter
(74) *Attorney, Agent, or Firm* — NSIP Law

(57) ABSTRACT

The present invention relates to memory apparatuses and an operating methods using a heterogeneous memory array. An operation method of a memory apparatus using a heterogeneous memory array according to an embodiment of the present invention includes dividing an input bit into at least one data bit according to a mode bit, and writing the divided data bits in each cell of the memory array by using a cell level of the memory array which is configured according to the mode bit.

20 Claims, 7 Drawing Sheets

MEMORY APPARATUS AND METHODS WITH HETEROGENEOUS MEMORY ARRAY ARCHITECTURE

CROSS-REFERENCE TO RELATED APPLICATION

This application claims benefit of priority to Korean Patent Application No. 10-2018-0030930 filed Mar. 16, 2018 in the Korean Intellectual Property Office, the disclosure of which is incorporated herein by reference in its entirety.

BACKGROUND

Field of the Invention

The present invention relates to memory apparatuses and operating methods for the same for a next generation memory.

Related Art

There have been difficulties in implementation of the conventional memory devices such as a Dynamic random access memory (DRAM), a Static random access memory (SRAM), a Flash memory, and the like, since there are various problems such as short channel length, tunneling effect, and the like in manufacturing processes thereof as the manufacturing processes become fine.

As an alternative device, researches and developments for next generation memory devices have been vigorously progressed. Representative next generation memory devices include a Phase Change Memory (PCM), a Resistive RAM (RRAM) and a Spin transfer torque RAM (STT-RAM). Different from the conventional scheme of writing and reading values using charge/discharge, the next generation memory devices store and read data by using a resistance value of phase change material.

In order for the next generation memory devices to replace the conventional memory devices, the next generation memory devices require high information density. Likewise the Flash memory, the next generation memory devices require a use of multi-level cell (MLC) structure that stores several bits in a single cell, which has been researched actively.

SUMMARY

The next generation memory devices using the multi-level cell (MLC) structure store a value by changing a state of phase change material to a state that corresponding to a specific resistance value. For a desired resistance value configuration in this process, repeated writing processes are required. In addition, according to the resistance drift phenomenon that the next generation memory devices, a resistance value of a cell is changed as time goes on, which causes a problem that data stored in the cell is changed. In order to compensate this problem, a periodic writing process is additionally required.

Such characteristics owned by the multi-level cell (MLC) and the resistance drift phenomenon degrade reliability of the next generation memory devices, and significantly restrict the lifetime of memory devices. That is, the next generation memory devices using the multi-level cell (MLC) structure have difficulty in replacing the conventional memory devices so far owing to the low reliability and the short lifetime.

Some embodiments of the present invention are to provide memory apparatuses using heterogeneous memory array and the operating methods based on a new form of memory cell array and a wear leveling architecture for improving reliability and lifetime.

Some embodiments of the present invention are to provide memory apparatuses using heterogeneous memory array and the operating methods which can improve reliability and lifetime of next generation memory apparatuses using the multi-level cell (MLC) structure by applying a new form of memory array and a wear leveling scheme including at least one multi-level cell (MLC) and at least one Single-level cell (SLC).

Some embodiments of the present invention are to provide memory apparatuses using heterogeneous memory array and the operating methods which can replace the conventional DRAM, SRAM, Flash memory, and the like to next generation memory apparatuses by improving reliability and lifetime, which are the biggest problems owned by the next generation memory apparatuses.

According to one example embodiment of the present invention, a memory apparatus using a heterogeneous memory array including a memory array including a plurality of memory cells and a peripheral part disposed around the memory array, the peripheral part may include a reconfiguration logic unit for dividing an input bit into at least one data bit according to a mode bit; and a write control unit for writing the divided data bits in each cell of the memory array by using a cell level of the memory array which is configured according to the mode bit.

The memory array may include at least one basic unit including a plurality of memory cells which is operated with n multi-level cells and m single-level cells, where n is a natural number and m is a natural number, based on the mode bit.

The memory array may be configured by using basic units which are repeatedly arranged.

The reconfiguration logic unit may divide an input bit into data bits corresponding to n multi-level cells and m single-level cells, where n is a natural number and m is a natural number, according to the mode bit.

The device may further include a data conversion unit for reading the written data bits and converting into an output bit by using a cell level of the memory array which is configured according to the mode bit.

The data conversion unit may include: a sense amplifier for sensing a resistance of each cell of the memory array in which data bits are written; and a resistance decoder for converting the sensed resistance of each cell into an output bit by using a cell level of the memory array which is configured according to the mode bit.

The device may further include a mode changing unit for changing the mode bit according to a preconfigured change condition.

The mode changing unit may change the mode bit in every preconfigured change period, change the mode bit for each memory array or change the mode bit for each basic unit having a plurality of memory cells.

The mode changing unit may change the mode bit such that a position of at least one multi-level cell or a position of at least one single-level cell is changed.

The reconfiguration logic unit may divide a parity bit for error correction of an input bit into at least one sub parity bit according to the mode bit, and the write control unit may write the divided sub parity bits in each cell of the memory array by using a cell level of the memory array which is configured according to the mode bit.

Meanwhile, according to another example embodiment of the present invention, an operation method of a memory apparatus using a heterogeneous memory array including a plurality of memory cells and a peripheral part disposed around the memory array may include dividing an input bit into at least one data bit according to a mode bit; and writing the divided data bits in each cell of the memory array by using a cell level of the memory array which is configured according to the mode bit.

The memory array may include at least one basic unit including a plurality of memory cells which is operated with n multi-level cells and m single-level cells, where n is a natural number and m is a natural number, based on the mode bit.

The memory array may be configured by using basic units which are repeatedly arranged.

The step of dividing may divide an input bit into data bits corresponding to n multi-level cells and m single-level cells, where n is a natural number and m is a natural number, according to the mode bit.

The method may further include reading the written data bits and converting into an output bit by using a cell level of the memory array which is configured according to the mode bit.

The step of converting into an output bit may include: sensing a resistance of each cell of the memory array in which data bits are written; and converting the sensed resistance of each cell into an output bit by using a cell level of the memory array which is configured according to the mode bit.

The method may further include changing the mode bit according to a preconfigured change condition.

The step of changing the mode bit may change the mode bit in every preconfigured change period, change the mode bit for each memory array or change the mode bit for each basic unit having a plurality of memory cells.

The step of changing the mode bit may change the mode bit such that a position of at least one multi-level cell or a position of at least one single-level cell is changed.

The method may further include dividing a parity bit for error correction of an input bit into at least one sub parity bit according to the mode bit, and writing the divided sub parity bits in each cell of the memory array by using a cell level of the memory array which is configured according to the mode bit.

DETAILED DESCRIPTION OF EXEMPLARY EMBODIMENTS

Figure 1:
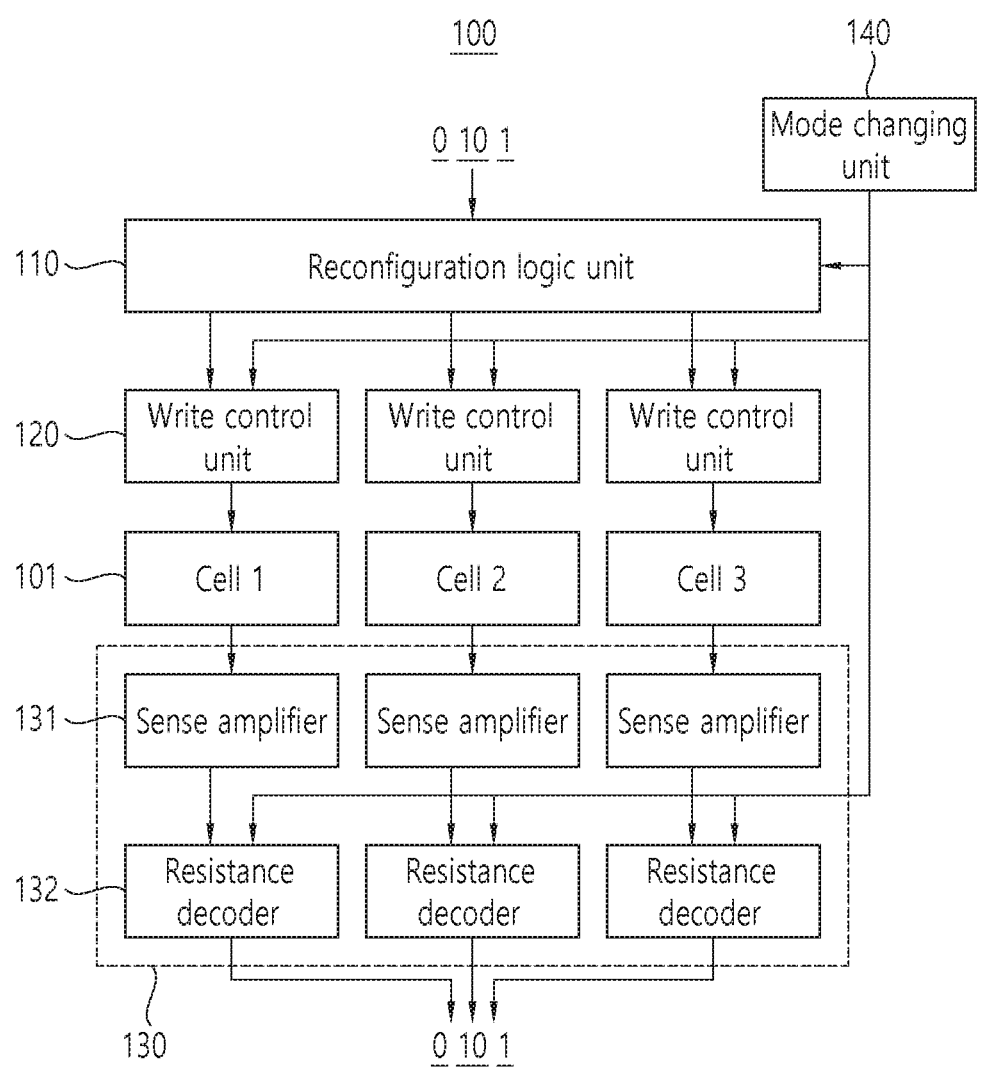
FIG. 1 is a configuration diagram for describing a configuration of a memory apparatus using a heterogeneous memory array according to an embodiment of the present invention.

The present invention may have various modifications and various embodiments and specific embodiments will be illustrated in the drawings and described in detail in the detailed description.

However, this does not limit the present invention to specific embodiments, and it should be understood that the present invention covers all the modifications, equivalents and replacements included within the idea and technical scope of the present invention.

Terms including as first, second, and the like are used for describing various constituent elements, but the constituent elements are not limited by the terms. The terms are used only to discriminate one constituent element from another component. For example, a first component may be referred to as a second component, and similarly, the second component may be referred to as the first component without departing from the scope of the present invention. A term 'and/or' includes a combination of a plurality of associated disclosed items or any item of the plurality of associated disclosed items.

When it is described that a component is "connected to" or "accesses" another component, the component may be directly connected to or access the other component or a third component may be present there between. In contrast, it should be understood that, when it is described that an element is "directly connected to" or "directly access" another element, it is understood that no element is present between the element and another element.

Terms used in the present application are used only to describe specific embodiments, and are not intended to limit the present invention. A singular form may include a plural form if there is no clearly opposite meaning in the context. In the present application, it should be understood that term "include" or "have" indicates that a feature, a number, a step, an operation, a component, a part or the combination thereof described in the specification is present, but does not exclude a possibility of presence or addition of one or more other features, numbers, steps, operations, components, parts or combinations thereof, in advance.

Unless it is contrarily defined, all terms used herein including technological or scientific terms have the same meanings as those generally understood by a person with ordinary skill in the art. Terms which are defined in a generally used dictionary should be interpreted to have the same meaning as the meaning in the context of the related art, and are not interpreted as an ideal meaning or excessively formal meanings unless clearly defined in the present application.

Hereinafter, preferred embodiments of the present invention will be described in detail with reference to the accompanying drawings and in describing the preferred embodiments with reference to the accompanying drawings, the same reference numeral will refer to the same or corresponding component regardless of the reference numeral and a duplicated description thereof will be omitted.

FIG. 1 is a configuration diagram for describing a configuration of a memory apparatus using a heterogeneous memory array according to an embodiment of the present invention.

As shown in FIG. 1, a memory apparatus 100 using a heterogeneous memory array according to an embodiment of the present invention includes a memory array including a plurality of memory cells 101 and a peripheral part disposed around the memory array. The peripheral part includes a reconfiguration logic unit 110, a write control unit 120 and a data conversion unit 130. However, the elements shown in the drawing are not necessarily essential elements. The memory apparatus 100 may be implemented by more elements than the elements shown in the drawing, but may also be implemented by fewer elements than the elements shown in the drawing.

Hereinafter, it is detailed configuration and operation of each of the elements of the memory apparatus 100 shown in FIG. 1.

In the memory apparatus 100 according to an embodiment of the present invention, the reconfiguration logic unit 110 divides an input bit to at least one data bit depending on a mode bit. Here, the reconfiguration logic unit 110 may divide an input bit into data bits corresponding to at least one multi-level cell or at least one single-level cell depending on a mode bit. The reconfiguration logic unit 110 may divide an input bit into data bits corresponding to n multi-level cells or m single-level cells depending on a mode bit, where n is a natural number and m is a natural number.

The write control unit 120 writes the data bits which are divided in the reconfiguration logic unit 110 in each cell of the memory array using a cell level of the memory array which is configured according to the mode bit. In the writing operation of the write control unit 120, depending on a writing data bit, a resistance value of a variable resister of a memory cell may increase or a resistance value of a variable resister of a memory cell may decrease. For example, each of the memory cells of the memory array may have a resistance value according to the currently stored data, and the resistance value may increase or decrease depending on the data to be stored in each of the memory cells.

By using the cell level of the memory array which is configured according to the mode bit, the data conversion unit 130 reads the data bits written by the write control unit 120 and converts to an output bit.

As an example of the data conversion unit 130, the data conversion unit 130 may include a sense amplifier 131 and a resistance decoder 132.

The sense amplifier 131 may sense a resistance of each cell of the memory array in which data bits are written.

The resistance decoder 132 may convert the resistance of each cell sensed in the sense amplifier 131 to an output bit by using a cell level of the memory array which is configured according to a mode bit.

The memory array includes at least one basic unit having a plurality of memory cells operated with n multi-level cells and m single-level cells based on a mode bit, where n is a natural number and m is a natural number. Here, the memory array may be configured with using the basic units which are repeatedly arranged.

Hereinafter, it is described the memory array using the conventional multi-level cell (MLC) structure and the cell structure of a heterogeneous memory array according to an embodiment of the present invention.

In the memory array using the conventional multi-level cell (MLC) structure, all cells in the memory array are configured with multi-level cells. For example, in the case of using Four-level cell (4LC), each cell stores 2-bit data.

On the other hand, the heterogeneous memory array according to an embodiment of the present invention uses a duel memory cell, that is, a single-level cell (SLC) and a multi-level cell (MLC) are used together in a single memory array.

For example, in the case that a basic unit includes three cells, the basic unit of the heterogeneous memory array according to an embodiment of the present invention includes one multi-level cell (MLC) and two single-level cells (SLCs). One memory array is configured with such basic units which are repeatedly connected.

In the single-level cell (SLC), the error owing to the resistance drift does not occur. Accordingly, in the heterogeneous memory array according to an embodiment of the present invention, as the number of multi-level cells (MLCs) is decreased, reliability of the memory array may be significantly increased.

Each of the memory cells 101 may be a single-level cell (SLC) that stores one bit, or a multi-level cell (MLC) that stores data of at least two bits. The physical cell structure of each of the memory cells 101 is the same. However, the memory apparatus 100 may store a value to be written in the memory cell in accordance with a single-level cell (SLC) or a multi-level cell (MLC). That is, the memory apparatus 100 may store one bit or multiple bits in a single memory cell selectively.

As such, the memory array may include at least one single-level cell (SLC) and at least one multi-level cell (MLC) together. In the case that one bit data is recorded in a single memory cell, the memory cells 101 may have two resistance level distributions depending on the recorded data. Alternatively, in the case that two bit data are recorded in a single memory cell, the memory cells 101 may have four resistance level distributions depending on the recorded data. In another embodiment, in the case of a triple level cell (TLC) in which 3 bit data is stored in a single memory cell, the memory cells 101 may have eight resistance level distributions depending on the recorded data. However, the present invention is not limited thereto. In another embodiment, the memory cells 101 may include memory cells that may store data of 4 bit or more, respectively.

In addition, in an embodiment, the memory array may include memory cells of 2-dimensional horizontal structure. In another embodiment, the memory array may include memory cells of 3-dimensional vertical structure.

Meanwhile, the memory array may include resistive memory cells including a variable resistor device. For example, in the case that the variable resistor device includes a phase change material (e.g., Ge—Sb—Te (GST)) and the resistance is changed depending on a temperature, the resistive memory apparatus may be a PRAM. For another example, in the case that the variable resistor device is formed with an upper electrode, a lower electrode and a complex metal oxide therebetween, the resistive memory apparatus may be a RRAM. For another example, in the case that the variable resistor device is formed with an upper electrode of a magnetic material, a lower electrode of a magnetic material and a dielectric therebetween, the resistive memory apparatus may be a MRAM.

The variable resistor R may be changed to one of a plurality of resistance states by an electrical pulse introduced from the write control unit 120. In an embodiment, the variable resistor R may include a phase-change material of which crystal state is changed depending on an amount of current. Various types of materials may be used for the phase-change material such as binary materials, GaSb, InSb, InSe. $Sb_2Te_3$ and GeTe, ternary materials, GeSbTe, GaSeTe, InSbTe, $SnSb_2Te_4$ and InSbGe and quaternary materials, AgInSbTe, (GeSn)SbTe, GeSb(SeTe), $Te_{81}Ge_{15}Sb_2S_2$, and the like.

Such a phase-change material may have an amorphous state in which a resistance is relatively high and a crystal state in which a resistance is relatively low. In such a phase-change material, a phase may be changed according to Joule's eat which is generated according to an amount of current. Furthermore, data may be stored by using such a phase-change phenomenon. Meanwhile, in another embodiment, the variable resistor R may have perovskite compounds, transition metal oxides, magnetic materials, ferromagnetic materials or antiferromagnetic materials, instead of the phase-change material.

Meanwhile, as another embodiment of the present invention, the memory apparatus 100 may further includes a mode changing unit 140.

The mode changing unit 140 may change a mode bit according to a preconfigured change condition.

For example, the mode changing unit 140 may change a mode bit in every preconfigured change period.

For another example, the mode changing unit 140 may change a mode bit for each memory array.

For another example, the mode changing unit 140 may change a mode bit for each basic unit including a preconfigured number of cells in the memory array.

For another example, the mode changing unit 140 may change the mode bit such that a position of at least one multi-level cell or a position of at least one single-level cell is changed.

Meanwhile, a mode bit may be applied even for a parity bit for error correction of an input bit.

The reconfiguration logic unit 110 may divide the parity bit for error correction of an input bit into at least one sub parity bit according to the mode bit.

In addition, the write control unit 120 may write the divided sub parity bits in each cell of the memory array by using a cell level of the memory array, which is configured according to the mode bit.

Hereinafter, it is described the wear leveling architecture that uses a heterogeneous memory array for an input bit of 4 bits to be stored in each cell of the heterogeneous memory array, for example.

First, the reconfiguration logic unit 110 may divide 4 bits into three data bits in accordance with a mode bit.

Further, considering the mode bit, the write control unit 120 may configure writing current in accordance with each single-level cell (SLC) or multi-level cell (MLC), and then, may input the divided data bits in each cell of the memory array.

Later, considering the mode bit, the resistance decoder 132 may convert the resistance value calculated by the sense amplifier 131 into an output bit value that corresponds to the single-level cell (SLC) or the multi-level cell (MLC).

As shown in FIG. 1, the operation in the memory apparatus 100 will be described by exemplifying the case that an input bit is 0101.

First, in the case that an input bit is 0101, the reconfiguration logic unit 110 may divide the input bit 0101 into three data bits, "0", "10" and "1" according to the mode bit. That is, the input bit 0101 may be divided into a single-level data bit "0", a multi-level data bit "10" and a single-level data bit "1", sequentially.

The write control unit 120 may identify that the cell levels of the memory array configured according to the mode bit are a single-level cell (SLC), a multi-level cell (MLC) and a single-level cell (SLC), sequentially. Subsequently, the write control unit 120 may write the first data bit "0" in accordance with the single-level cell (SLC). The write control unit 120 may write the second data bit "10" in accordance with the multi-level cell (MLC). The write control unit 120 may write the third data bit "1" in accordance with the single-level cell (SLC). That is, the first data bit "0" may be stored in cell 1, the second data bit "10" may be stored in cell 2, and the third data bit "1" may be stored in cell 3.

The data conversion unit 130 may identify that the cell levels of the memory array configured according to the mode bit are a single-level cell (SLC), a multi-level cell (MLC) and a single-level cell (SLC), sequentially. Subsequently, the data conversion unit 130 may convert the first data bit "0", which is written, into an output bit in accordance with the single-level cell (SLC). The data conversion unit 130 may convert the second data bit "10", which is written, into an output bit in accordance with the multi-level cell (MLC). The data conversion unit 130 may convert the third data bit "1", which is written, into an output bit in accordance with the single-level cell (SLC).

Meanwhile, as another embodiment of the present invention, it is described the case that the cell level of the memory array configured according to a changed mode bit is a multi-level cell (MLC), a single-level cell (SLC) and a single-level cell (SLC), sequentially.

In another embodiment of the present invention, the reconfiguration logic unit 110 may divide the input bit 0101 into three data bits, "01", "0" and "1" according to a changed mode bit. That is, the input bit 0101 may be divided into a multi-level data bit "01", a single-level data bit "0" and a single-level data bit "1", sequentially.

The write control unit 120 may identify that the cell levels of the memory array configured according to the changed mode bit are a multi-level cell (MLC), a single-level cell (SLC) and a single-level cell (SLC), sequentially. Subsequently, the write control unit 120 may write the first data bit "01" in accordance with the multi-level cell (MLC). The write control unit 120 may write the second data bit "0" in accordance with the single-level cell (SLC). The write control unit 120 may write the third data bit "1" in accordance with the single-level cell (SLC). That is, the first data bit "01" may be stored in cell 1, the second data bit "0" may be stored in cell 2, and the third data bit "1" may be stored in cell 3.

The data conversion unit 130 may identify that the cell levels of the memory array configured according to the changed mode bit are a multi-level cell (MLC), a single-level cell (SLC) and a single-level cell (SLC), sequentially. Subsequently, the data conversion unit 130 may convert the first data bit "01", which is written, into an output bit in accordance with the multi-level cell (MLC). The data conversion unit 130 may convert the second data bit "0", which is written, into an output bit in accordance with the single-level cell (SLC). The data conversion unit 130 may convert the third data bit "1", which is written, into an output bit in accordance with the single-level cell (SLC).

Meanwhile, the reconfiguration logic unit 110, the write control unit 120 and the data conversion unit 130 and the mode changing unit 140 according to an embodiment of the present invention may be implemented in at least one processor.

Figure 2:
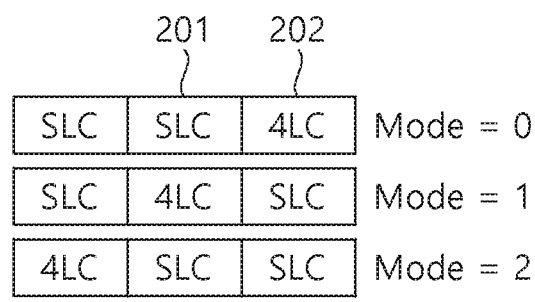
FIG. 2 is a diagram for describing a basic unit for storing data in a heterogeneous memory array according to an embodiment of the present invention.

FIG. 2 is a diagram for describing a basic unit for storing data in a heterogeneous memory array according to an embodiment of the present invention.

In an embodiment of the present invention, different from the memory array of the conventional next generation memory apparatus including only multi-level cells (MLCs), at least one single-level cell (SLC) and at least one multi-level cell (MLC) may be used together in a single memory array.

In FIG. 2, a basic unit for storing 4-bit data is shown. For example, the basic unit includes 4LC 202 which is a multi-level cell and two single-level cells 201. The memory array may be configured by using the basic unit repeatedly. In the case that 4-bit data is a basic unit, the basic unit may include one multi-level cell (MLC) and two single-level cells 201.

The heterogeneous memory array according to an embodiment of the present invention is configured with a plurality of basic units. The multi-level cell 202 and the single-level cells 201 are used together for the basic unit.

Different from the conventional memory array including only multi-level cells (MLCs), according to an embodiment of the present invention, at least one single-level cell (SLC) and at least one multi-level cell (MLC) may be used together in a single memory array.

Here, a single memory array may be configured by using the basic unit repeatedly. The basic units may be repeatedly used in a single memory array, but a position of the multi-level cell 202 or the single-level cells 201 may be changed.

In the memory apparatus 100 according to an embodiment of the present invention, for the wear leveling, a position of the multi-level cell 202 is persistently changed in the basic unit, and accordingly, lifetime of the whole memory may be increased.

Figure 3:
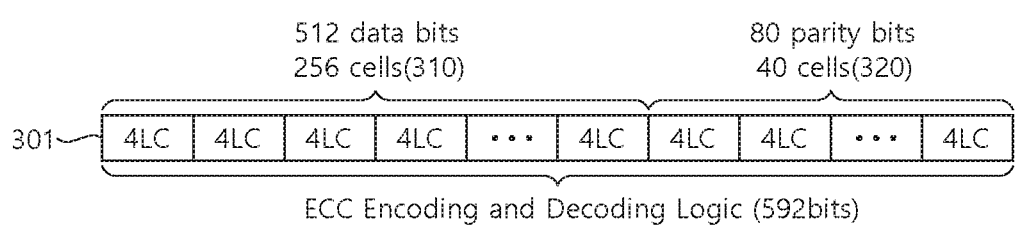
FIG. 3 is a diagram for describing a memory array of the conventional multi-level cell structure.

FIG. 3 is a diagram for describing a memory array of the conventional multi-level cell structure.

FIG. 3 shows the conventional memory array of a four level cell (4LC; 301) structure including four levels among multi-level cells. The conventional memory array shown in FIG. 3 is a configuration example of the memory array in which 512 data bits are stored in 256 cells 310. In the conventional memory array shown in FIG. 3, 80 parity bits are stored in 40 cells 320.

Figure 4:
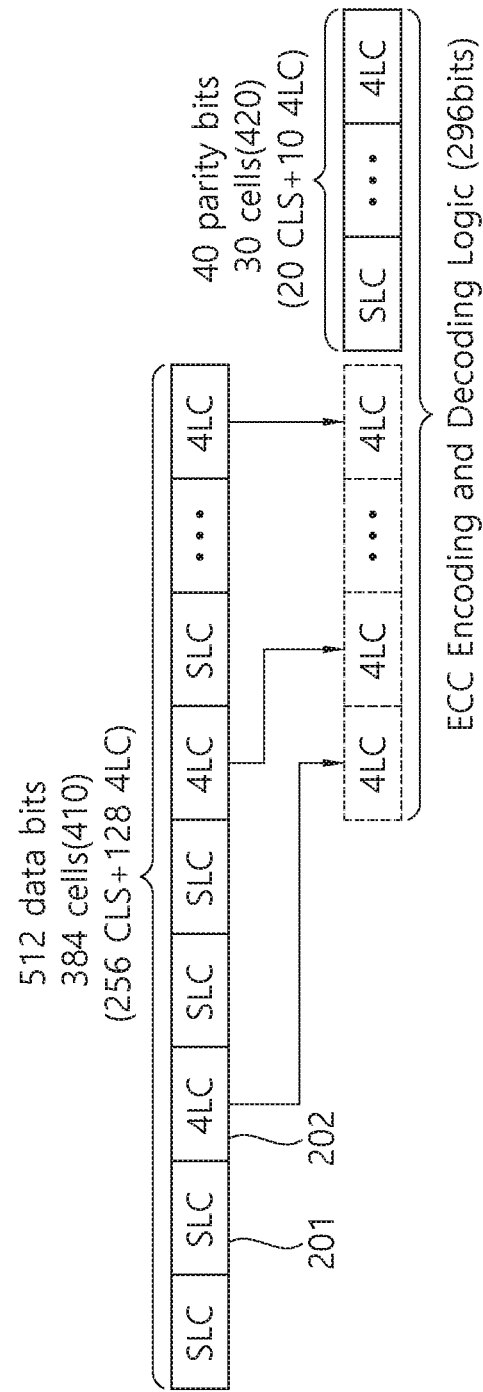
FIG. 4 is a diagram for describing a memory array of a heterogeneous level cell structure according to an embodiment of the present invention.

FIG. 4 is a diagram for describing a memory array of a heterogeneous level cell structure according to an embodiment of the present invention.

FIG. 4 shows a heterogeneous memory array including two single-level cell 201 and one 4LC 202 according to an embodiment of the present invention. The heterogeneous memory array shown in FIG. 4 is a configuration example of the memory array in which 512 data bits are stored in 384 cells 410. The 384 cells may include 256 single-level cells (SLCs) and 128 multi-level cells (MLCs). In the heterogeneous memory array shown in FIG. 4, 40 parity bits are stored in 30 cells 420. The 30 cells may include 20 single-level cells (SLCs) and 10 multi-level cells (MLCs).

As such, in the memory array of the conventional multi-level cell structure shown in FIG. 3, 296 4LCs 301 are used. However, in the memory array of the heterogeneous level cell structure according to an embodiment of the present invention shown in FIG. 4, 138 4LCs 202 and 276 single-level cells 201 are used. In an embodiment of the present invention, single-level cells are additionally used, but smaller number of multi-level cells is used than the conventional memory array structure. That is, in an embodiment of the present invention, 158 4LCs are decreased, and accordingly, reliability of memory apparatus may be improved.

Here, although 4LC is used for a multi-level cell storing 2 bit, but the embodiments of the present invention are not limited to a specific level cell.

Meanwhile, FIG. 3 and FIG. 4 show the memory array configuration of 512-bit data to which an error correction code (ECC) scheme based on BCH-8 for error correction is applied.

In the case of the memory array for 512-bit data, assuming that BCH-8 error correction code (ECC) scheme is used, total 296 MLCs are required when the memory array is configured with 4LCs only. That is, 256 4LCs are required for data and 40 4LCs are required for parity.

However, in the case of the heterogeneous memory array according to an embodiment of the present invention, 138 multi-level cells (MLCs) and 276 single-level cells (SLCs) are required. In an embodiment of the present invention, total number of cells is slightly increased, but the number of MLCs is significantly decreased. In the case of the memory array using MLCs, reliability is determined by the number of MLCs. Therefore, as the number of MLCs is significantly decreased, reliability is increased.

Meanwhile, the major factor of limiting lifetime of a general next generation memory apparatus is the repeated writing operation for storing data.

In order to increase lifetime, the memory array according to an embodiment of the present invention uses a multi-level cell (MLC) only in a single cell among three cells. In addition, in an embodiment of the present invention, the wear leveling scheme is applied, and lifetime of the whole memory apparatus may be significantly increased.

In the memory apparatus 100 according to an embodiment of the present invention, in order to increase lifetime, a position of a multi-level cell (MLC) may be changed in a basic unit of the memory array.

In a particular embodiment, in the case that a mode bit is 0, a multi-level cell (MLC) may be located in the first position of the basic unit of the memory apparatus 100.

In the case that a mode bit is 1, a multi-level cell (MLC) may be located in the second position of the basic unit of the memory apparatus 100.

In the case that a mode bit is 2, a multi-level cell (MLC) may be located in the third position of the basic unit of the memory apparatus 100.

In the memory apparatus 100, a position of a multi-level cell (MLC) may be changed in the basic unit according to a mode bit.

Through this, the repeated writing operation of a multi-level cell (MLC) is uniformly distributed in the memory apparatus 100, and accordingly, lifetime of the whole memory apparatus may be increased.

As such, the number of multi-level cells (MLCs) that may cause an error is decreased in the memory apparatus 100, Error Correction Code (ECC) for error detection and correction may be optimized. Since only the multi-level cell (MLC) causes a resistance drift error, as the number of multi-level cells (MLCs) is decreased, probability of causing an error is decreased.

In the memory apparatus 100 according to an embodiment of the present invention, a lighter error correction code (ECC) is used in comparison with the conventional multi-level cell (MLC), performance (reading/writing time) may be improved, and area overhead owing to addition of error correction code (ECC) logic may be reduced.

Figure 5:
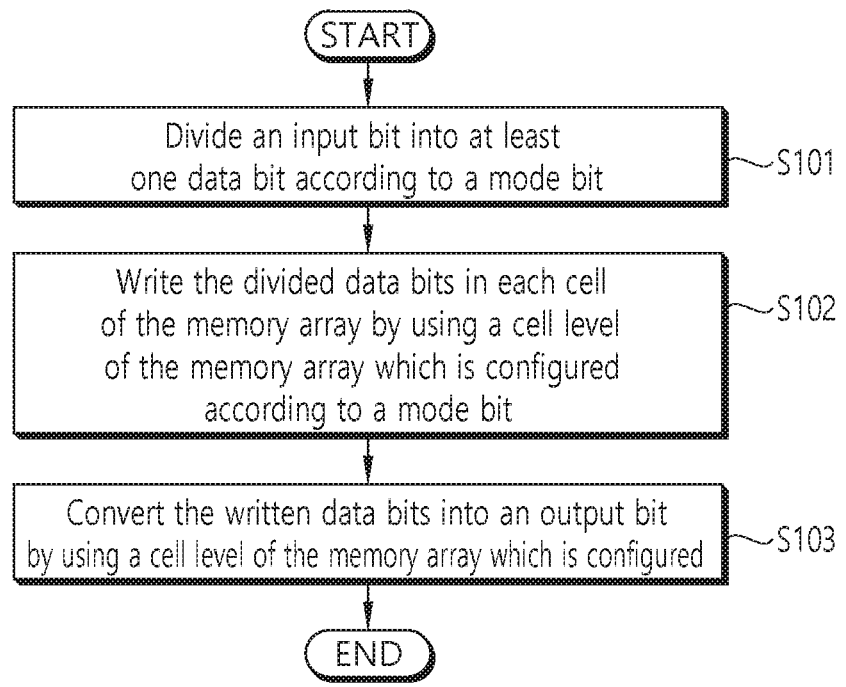
FIG. 5 is a flowchart for describing an operation method of a memory apparatus using a heterogeneous memory array according to an embodiment of the present invention.

FIG. 5 is a flowchart for describing an operation method of a memory apparatus using a heterogeneous memory array according to an embodiment of the present invention.

As shown in FIG. 5, in step S101, the memory apparatus 100 according to an embodiment of the present invention divides an input bit into at least one data bit according to a mode bit.

In step S102, the memory apparatus 100 writes the divided data bits in each cell of the memory array by using a cell level of the memory array which is configured according to a mode bit.

In step S103, the memory apparatus 100 reads the written data bits and converts into an output bit by using a cell level of the memory array which is configured.

Figure 6:
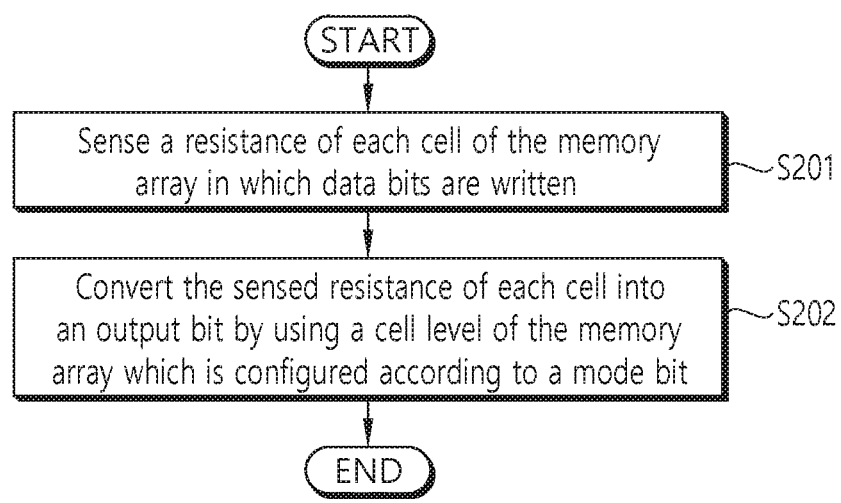
FIG. 6 is a flowchart for describing an output bit convert operation in an operation method of a memory apparatus according to an embodiment of the present invention.

FIG. 6 is a flowchart for describing an output bit convert operation in an operation method of a memory apparatus according to an embodiment of the present invention.

As shown in FIG. 6, in step S201, the memory apparatus 100 according to an embodiment of the present invention senses a resistance of each cell of the memory array in which data bits are written.

In step S202, the memory apparatus 100 converts the sensed resistance of each cell into an output bit by using a cell level of the memory array which is configured according to a mode bit.

Figure 7:
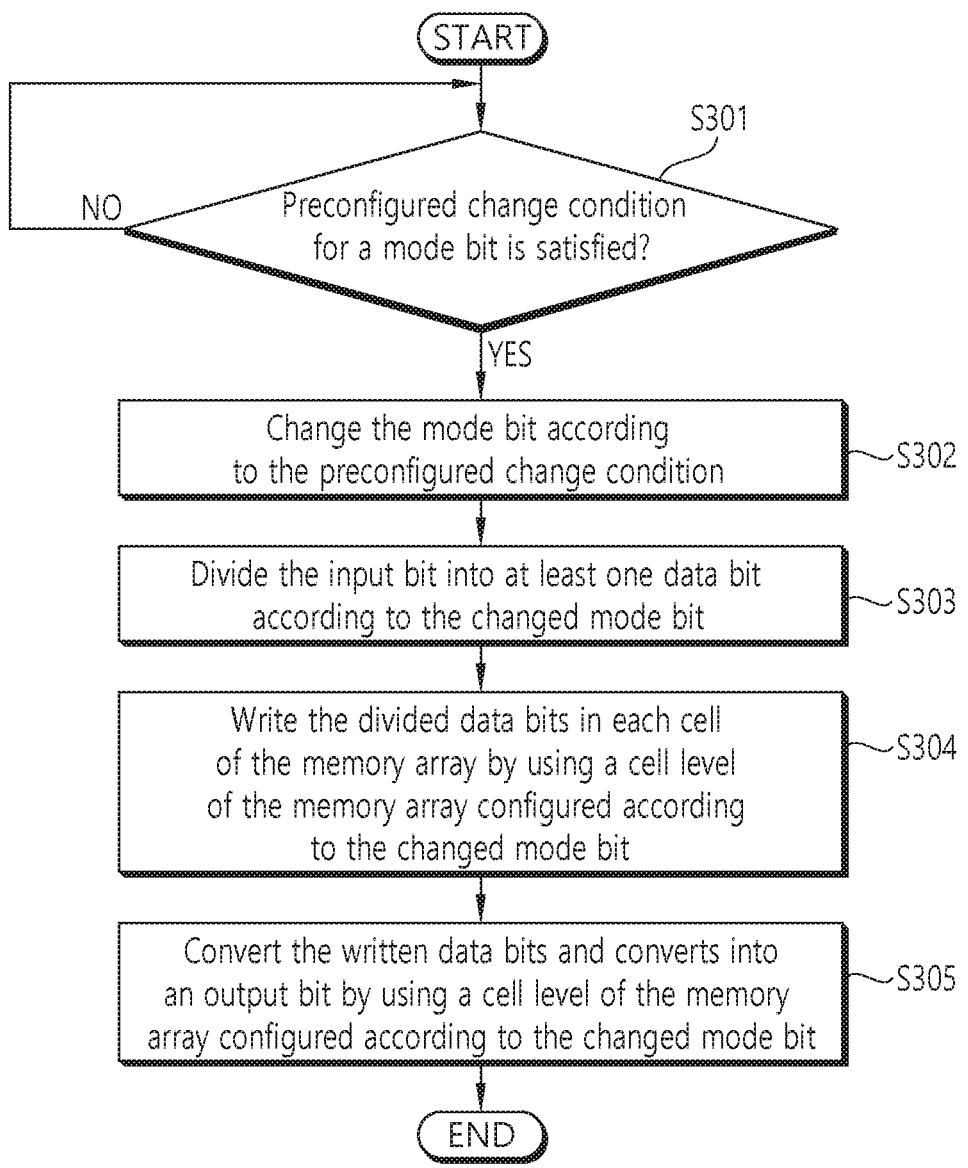
FIG. 7 is a flowchart for describing an output bit convert operation in an operation method of a memory apparatus according to an embodiment of the present invention.

FIG. 7 is a flowchart for describing an output bit convert operation in an operation method of a memory apparatus according to an embodiment of the present invention.

As shown in FIG. 7, in step S301, the memory apparatus 100 according to an embodiment of the present invention checks whether a preconfigured change condition for a mode bit is satisfied.

In step S302, as a result of the check (step, S301), when the preconfigured change condition for a mode bit is satisfied, the memory apparatus 100 changes the mode bit according to the preconfigured change condition. On the other hand, as a result of the check (step, S301), when the preconfigured change condition for a mode bit is not satisfied, the memory apparatus 100 performs from the step S301 of checking whether a preconfigured change condition for a mode bit is satisfied again.

In step S303, the memory apparatus 100 divides the input bit into at least one data bit according to the changed mode bit.

In step S304, the memory apparatus 100 writes the divided data bits in each cell of the memory array by using a cell level of the memory array configured according to the changed mode bit.

In step S305, the memory apparatus 100 converts the written data bits and converts into an output bit by using a cell level of the memory array configured according to the changed mode bit.

Meanwhile, the experiment contents and the result are described for an embodiment of the present invention.

The memory apparatus 100 according to an embodiment of the present invention uses the heterogeneous memory array structure including at least one multi-level cell (MLC) and at least one single-level cell (SLC), and accordingly, reliability is increased as much as $10^5$ in comparison with the 512-bit memory array including only 4LCs.

Reliability is described based on reliability of $2.5 \times 10^{-11}$ of DRAM. In order to attain reliability of $2.5 \times 10^{-11}$, the conventional multi-level cell (MLC) array requires BCH-24 ECC scheme.

On the other hand, the memory apparatus 100 according to an embodiment of the present invention may have reliability of the same level or more even in BCH-16 ECC scheme. As such, in the memory apparatus 100 according to an embodiment of the present invention, the ECC performance is increased by two or more times in comparison with the conventional multi-level cell (MLC) array structure and area overhead thereof is a half or less.

In addition, the memory apparatus 100 according to an embodiment of the present invention distributes the writing operation of a multi-level cell (MLC) uniformly throughout each cell of the memory array through the wear leveling architecture, and accordingly, lifetime of the memory array may be increased up to maximum 57%.

Meanwhile, the memory apparatus 100 according to an embodiment of the present invention may be implemented by the memory array including a plurality of memory cells 101 and a processor for controlling an operation using the memory array, which is disposed around the memory array.

The processor divides an input bit into at least one data bit according to a mode bit, and writes the divided data bits in each cell of the memory array by using a cell level of the memory array which is configured according to the mode bit.

According to various embodiments, the memory array may include at least one basic unit including a plurality of memory cells which is operated with n multi-level cells and m single-level cells, where n is a natural number and m is a natural number, based on the mode bit.

According to various embodiments, the memory array may be configured by using basic units which are repeatedly arranged.

According to various embodiments, the processor may divide an input bit into data bits corresponding to n multi-level cells and m single-level cells, where n is a natural number and m is a natural number, according to the mode bit.

According to various embodiments, the processor may read the written data bits and convert into an output bit by using a cell level of the memory array which is configured according to the mode bit.

According to various embodiments, the processor may include a sense amplifier for sensing a resistance of each cell of the memory array in which data bits are written and a resistance decoder for converting the sensed resistance of each cell into an output bit by using a cell level of the memory array which is configured according to the mode bit.

According to various embodiments, the processor may change the mode bit according to a preconfigured change condition.

According to various embodiments, the processor may change the mode bit in every preconfigured change period, change the mode bit for each memory array or change the mode bit for each basic unit having a plurality of memory cells.

According to various embodiments, the processor may change the mode bit such that a position of at least one multi-level cell or a position of at least one single-level cell is changed.

According to various embodiments, the processor may divide a parity bit for error correction of an input bit into at least one sub parity bit according to the mode bit, and write the divided sub parity bits in each cell of the memory array by using a cell level of the memory array which is configured according to the mode bit.

It is available that the operation method of the memory apparatus 100 according to an embodiment of the present invention is implemented by codes readable by a computer in a recording medium readable by a computer.

The operation method of the memory apparatus 100 according to an embodiment of the present invention includes a storage medium readable by a computer as a storage medium readable by a computer including commands executable by the processor, the commands includes dividing, by the processor, an input bit into at least one data bit according to a mode bit and writing the divided data bits in each cell of the memory array by using a cell level of the memory array which configured according to the mode bit.

The computer-readable recording medium includes all kinds of recording media storing data which can be interpreted by a computer system. For example, the computer-readable recording medium may include a Read Only Memory (ROM), a Random Access Memory (RAM), a magnetic tape, a magnetic disk, a flash memory, an optical data storage device, and the like. In addition, the computer-readable recording medium may be distributed in computer systems connected to a computer network, and may be stored and executed as a code readable in a distribution manner.

While the present invention has been described with reference to the accompanying drawings and exemplary embodiments, it is to be understood that the invention is not limited by the accompanying drawings and embodiments. It will be understood by those skilled in the art that various changes in form and details may be made therein without departing from the spirit and scope of the invention as defined by the appended claims.

In particular, the described features may be implemented within digital electronic circuitry, or computer hardware, firmware, or combinations thereof. The features may be implemented in a computer program product embodied in a storage device in a machine-readable storage device, for example, for execution by a programmable processor. Also, the features may be performed by a programmable processor executing a program of instructions for performing functions of the described embodiments, by operating on input data and generating an output. The described features may be implemented in at least one computer programs that can be executed on a programmable system including at least one programmable processor, at least one input device, and at least one output device which are combined to receive data and directives from a data storage system and to transmit data and directives to the data storage system. A computer program includes a set of directives that can be used directly or indirectly within a computer to perform a particular operation on a certain result. A computer program may be written in any form of programming language including compiled or interpreted languages, and may be used in any form included as modules, elements, subroutines, or other units suitable for use in other computer environments or independently operable programs.

Suitable processors for execution of the program of directives include, for example, both general-purpose and special-purpose microprocessors, and a single processor or one of multiple processors of other type of computer. In addition, storage devices suitable for implementing the computer program directives and data implementing the described features include, for example, semiconductor memory apparatuses such as EPROM, EEPROM, and flash memory apparatuses, magnetic devices such as internal hard disks and removable disks, magneto-optical disks, and all forms of nonvolatile memories including CD-ROM and DVD-ROM disks. The processor and memory may be integrated within Application-Specific Integrated Circuits (ASICs) or added by ASICs.

While the present invention has been described on the basis of a series of functional blocks, it is not limited by the embodiments described above and the accompanying drawings and it will be apparent to those skilled in the art that various substitutions, modifications and variations can be made without departing from the scope of the present invention.

The combination of the above-described embodiments is not limited to the above-described embodiments, and various forms of combination in addition to the above-described embodiments may be provided according to implementation and/or necessity.

In the above-described embodiments, the methods are described on the basis of a flowchart as a series of operations or blocks, but the present invention is not limited to the order of the operations, and some operations may occur in different orders or at the same time unlike those described above. It will also be understood by those skilled in the art that the operations shown in the flowchart are not exclusive, and other operations may be included, or one or more operations in the flowchart may be omitted without affecting the scope of the present invention.

The above-described embodiments include examples of various aspects. While it is not possible to describe every possible combination for expressing various aspects, one of ordinary skill in the art will recognize that other combinations are possible. Accordingly, it is intended that the present invention include all alternatives, modifications and variations that fall within the scope of the following claims.

So far, the present invention is described with reference to drawings and embodiments. However, it is understood that the scope of the present invention is not limited to the drawings and the embodiments, and those skilled in the art may modify and change the present invention in various ways within the scope not departing from the concept and the scope of the present invention written in the following claims.

The embodiments of the present invention are available to provide memory apparatuses using heterogeneous memory array and the operating methods based on a new form of memory cell array and a wear leveling architecture for improving reliability and lifetime.

The embodiments of the present invention are available to improve reliability and lifetime of next generation memory apparatuses using the multi-level cell (MLC) structure by applying a new form of memory array and a wear leveling scheme including at least one multi-level cell (MLC) and at least one Single-level cell (SLC).

The embodiments of the present invention are available to replace the conventional DRAM, SRAM, Flash memory, and the like to next generation memory apparatuses by improving reliability and lifetime, which are the biggest problems owned by the next generation memory apparatuses.

What is claimed is:

1. A memory apparatus using a heterogeneous memory array including a memory array including a plurality of memory cells and a peripheral part disposed around the memory array, the peripheral part comprising:
    a reconfiguration logic unit for dividing a series of input bits into at least one data bit according to a mode bit; and
    a write control unit for writing the divided data bits in each cell of the memory array by using a cell level of the memory array which is configured according to the mode bit,
    wherein a series of parity bits of the input bits are configured based on the mode bit.

2. The memory apparatus using a heterogeneous memory array of claim 1, wherein the memory array includes at least one basic unit including a plurality of memory cells which is operated with n multi-level cells and m single-level cells, where n is a natural number and m is a natural number, based on the mode bit.

3. The memory apparatus using a heterogeneous memory array of claim 2, wherein the memory array is configured by using a plurality of the basic unit.

4. The memory apparatus using a heterogeneous memory array of claim 1, wherein the reconfiguration logic unit divides the input bits into data bits corresponding to n multi-level cells and m single-level cells, where n is a natural number and m is a natural number, according to the mode bit.

5. The memory apparatus using a heterogeneous memory array of claim 1, further comprising a data conversion unit for reading the written data bits and converting into an output bit by using a cell level of the memory array which is configured according to the mode bit.

6. The memory apparatus using a heterogeneous memory array of claim 5, wherein the data conversion unit includes:
   a sense amplifier for sensing a resistance of each cell of the memory array in which data bits are written; and
   a resistance decoder for converting the sensed resistance of each cell into an output bit by using a cell level of the memory array which is configured according to the mode bit.

7. The memory apparatus using a heterogeneous memory array of claim 1, further comprising a mode changing unit for changing the mode bit according to a preconfigured change condition.

8. The memory apparatus using a heterogeneous memory array of claim 7, wherein the mode changing unit changes the mode bit in every preconfigured change period, changes the mode bit for each memory array or changes the mode bit for each basic unit having a plurality of memory cells.

9. The memory apparatus using a heterogeneous memory array of claim 7, wherein the mode changing unit changes the mode bit such that a position of at least one multi-level cell or a position of at least one single-level cell is changed.

10. A memory apparatus using a heterogeneous memory array including a memory array including a plurality of memory cells and a peripheral part disposed around the memory array, the peripheral part comprising:
    a reconfiguration logic unit for dividing a series of input bits into at least one data bit according to a mode bit; and
    a write control unit for writing the divided data bits in each cell of the memory array by using a cell level of the memory array which is configured according to the mode bit,
    wherein the reconfiguration logic unit divides a series of parity bits for error correction of the input bits into at least one sub parity bit according to the mode bit, and
    wherein the write control unit writes the divided sub parity bits in each cell of the memory array by using a cell level of the memory array which is configured according to the mode bit.

11. An operation method of a memory apparatus using a heterogeneous memory array including a plurality of memory cells and a peripheral part disposed around the memory array, comprising:
    dividing a series of input bits into at least one data bit according to a mode bit; and
    writing the divided data bits in each cell of the memory array by using a cell level of the memory array which is configured according to the mode bit,
    wherein a series of parity bits of the input bits are configured based on the mode bit.

12. The operation method of a memory apparatus using a heterogeneous memory array of claim 11, wherein the memory array includes at least one basic unit including a plurality of memory cells which is operated with n multi-level cells and m single-level cells, where n is a natural number and m is a natural number, based on the mode bit.

13. The operation method of a memory apparatus using a heterogeneous memory array of claim 12, wherein the memory array is configured by using a plurality of the basic unit.

14. The operation method of a memory apparatus using a heterogeneous memory array of claim 11, wherein the step of dividing divides the input bits into data bits corresponding to n multi-level cells and m single-level cells, where n is a natural number and m is a natural number, according to the mode bit.

15. The operation method of a memory apparatus using a heterogeneous memory array of claim 11, further comprising reading the written data bits and converting into an output bit by using a cell level of the memory array which is configured according to the mode bit.

16. The operation method of a memory apparatus using a heterogeneous memory array of claim 15, wherein the step of converting into an output bit includes:
    sensing a resistance of each cell of the memory array in which data bits are written; and
    converting the sensed resistance of each cell into an output bit by using a cell level of the memory array which is configured according to the mode bit.

17. The operation method of a memory apparatus using a heterogeneous memory array of claim 11, further comprising changing the mode bit according to a preconfigured change condition.

18. The operation method of a memory apparatus using a heterogeneous memory array of claim 17, wherein the step of changing the mode bit changes the mode bit in every preconfigured change period, changes the mode bit for each memory array or changes the mode bit for each basic unit having a plurality of memory cells.

19. The operation method of a memory apparatus using a heterogeneous memory array of claim 17, wherein the step of changing the mode bit changes the mode bit such that a position of at least one multi-level cell or a position of at least one single-level cell is changed.

20. The operation method of a memory apparatus using a heterogeneous memory array of claim 11, further comprising:
    dividing the parity bits for error correction of the input bits into at least one sub parity bit according to the mode bit, and
    writing the divided sub parity bits in each cell of the memory array by using a cell level of the memory array which is configured according to the mode bit.

* * * * *